United States Patent
Ueda et al.

(10) Patent No.: US 12,427,583 B2
(45) Date of Patent: Sep. 30, 2025

(54) DIAMOND CUTTING TOOL AND METHOD FOR MANUFACTURING THE SAME

(71) Applicant: SUMITOMO ELECTRIC HARDMETAL CORP., Hyogo (JP)

(72) Inventors: Akihiko Ueda, Hyogo (JP); Naoki Watanobe, Hyogo (JP); Satoru Kukino, Hyogo (JP)

(73) Assignee: SUMITOMO ELECTRIC HARDMETAL CORP., Hyogo (JP)

(*) Notice: Subject to any disclaimer, the term of this patent is extended or adjusted under 35 U.S.C. 154(b) by 732 days.

(21) Appl. No.: 17/636,878

(22) PCT Filed: Aug. 4, 2020

(86) PCT No.: PCT/JP2020/029738
§ 371 (c)(1),
(2) Date: Feb. 20, 2022

(87) PCT Pub. No.: WO2021/079586
PCT Pub. Date: Apr. 29, 2021

(65) Prior Publication Data
US 2022/0274186 A1    Sep. 1, 2022

(30) Foreign Application Priority Data

Oct. 24, 2019    (JP) .................. 2019-193506

(51) Int. Cl.
*B23B 27/20* (2006.01)
*B23P 15/28* (2006.01)

(52) U.S. Cl.
CPC .............. *B23B 27/20* (2013.01); *B23P 15/28* (2013.01); *B23B 2226/315* (2013.01); *B23C 2226/315* (2013.01); *Y10T 428/30* (2015.01)

(58) Field of Classification Search
None
See application file for complete search history.

(56) References Cited

U.S. PATENT DOCUMENTS

| | | | |
|---|---|---|---|
| 5,178,645 | A | 1/1993 | Nakamura et al. |
| 2018/0209040 | A1* | 7/2018 | Waki ............... C23C 16/279 |
| 2019/0232420 | A1 | 8/2019 | Kondameedi et al. |
| 2020/0030889 | A1 | 1/2020 | Harada |

(Continued)

FOREIGN PATENT DOCUMENTS

| | | |
|---|---|---|
| CN | 105269283 A | 1/2016 |
| EP | 4008474 A1 | 6/2022 |
| JP | H04-146007 A | 5/1992 |

(Continued)

*Primary Examiner* — Seth Dumbris
(74) *Attorney, Agent, or Firm* — Renner, Otto, Boisselle & Sklar, LLP

(57) ABSTRACT

There is provided a diamond cutting tool including a cutting edge portion containing single crystal diamond or binderless polycrystalline diamond and graphite, wherein when Raman spectroscopy is performed on a surface of the cutting edge portion, a ratio R1 of Ig1 to a sum of Id1 and the Ig1 is equal to or more than 0.5 and equal to or less than 1, where the Id1 represents a peak intensity of first carbon in the surface, the Ig1 represents a peak intensity of second carbon in the surface, the first carbon represents carbon that forms the single crystal diamond or the binderless polycrystalline diamond.

5 Claims, 2 Drawing Sheets

(56) References Cited

U.S. PATENT DOCUMENTS

2020/0261985 A1   8/2020   Kubo et al.

FOREIGN PATENT DOCUMENTS

| JP | 6-297207 A | 10/1994 |
| JP | 2005-88178 A | 4/2005 |
| JP | 2011-121142 A | 6/2011 |
| JP | 2020-40170 A | 3/2020 |
| JP | 2020-44640 A | 3/2020 |
| WO | 2016/175088 A1 | 11/2016 |
| WO | 2018/179666 A1 | 10/2018 |
| WO | 2019/065949 A1 | 4/2019 |

\* cited by examiner

DIAMOND CUTTING TOOL AND METHOD FOR MANUFACTURING THE SAME

TECHNICAL FIELD

The present disclosure relates to a diamond cutting tool and a method for manufacturing the same. The present application claims the priority based on Japanese Patent Application No. 2019-193506 filed on Oct. 24, 2019, the entire contents of which are incorporated herein by reference.

BACKGROUND ART

Conventionally, a diamond cutting tool including a cutting edge substantially made of diamond has been widely used for processing of a difficult-to-cut workpiece such as non-ferrous metal including an aluminum alloy, carbon fiber reinforced plastic (CFRP), glass fiber reinforced plastic (GFRP), ceramics, ceramic matrix composite (CMC), or cemented carbide. However, a cutting oil (hereinafter, also referred to as "coolant") cannot often be used for this type of workpiece during processing. In this case, the cutting edge is severely worn during processing, and thus, there is a demand for increasing the wear resistance of the diamond cutting tool.

In response to the above-described demand, Japanese Patent Laying-Open No. 2005-088178 wirt, 1) discloses a diamond sintered material tool in which a graphite layer is actively precipitated on a flank face by electric discharge processing. In the diamond sintered material tool, the lubricity of the graphite layer offers an increase in wear resistance of the flank face. Japanese Patent Laying-Open No. 2011-121142 (PTL 2) discloses a diamond-coated cutting tool in which a continuous graphite phase is formed in a thickness direction of a diamond coating that covers a surface of a tool base body. In the diamond-coated cutting tool, the graphite phase offers an increase in wear resistance and can prevent the diamond coating from falling off due to residual stress.

CITATION LIST

Patent Literature

PTL 1: Japanese Patent Laying-Open No. 2005-088178
PTL 2: Japanese Patent Laying-Open No. 2011-121142

SUMMARY OF INVENTION

A diamond cutting tool according to the present disclosure is a diamond cutting tool including a cutting edge portion containing single crystal diamond or binderless polyciystalline diamond and graphite, wherein when Raman spectroscopy is performed on a surface of the cutting edge portion, a ratio R1 of to a sum of Id1 and the Ig1 is equal to or more than 0.5 and equal to or less than 1, where the Id1 represents a peak intensity of first carbon in the surface, the Ig1 represents a peak intensity of second carbon in the surface, the first carbon represents carbon that forms the single crystal diamond or the binderless polycrystalline diamond, and the second carbon represents carbon that forms the graphite, and when Raman spectroscopy is performed on a plane located at a depth of 1 μm from the surface, a ratio R2 of Ig2 to a sum of Id2 and the Ig2 is equal to or more than 0.01 and equal to or less than 0.3, where the Id2 represents a peak intensity of the first carbon in the plane located at the depth of 1 μm from the surface, and the Ig2 represents a peak intensity of the second carbon in the plane located at the depth of 1 μm from the surface.

A method for manufacturing a diamond cutting tool according to the present disclosure is a method for manufacturing the diamond cutting tool, the method including: preparing the single crystal diamond or the binderless polycrystalline diamond; performing laser processing on the single crystal diamond or the binderless polycrystalline diamond under a first irradiation condition, thereby obtaining the cutting edge portion including a cutting edge; and performing laser processing on the cutting edge portion under a second irradiation condition different from the first irradiation condition, thereby generating graphite in the cutting edge portion.

DETAILED DESCRIPTION

Figure 1:
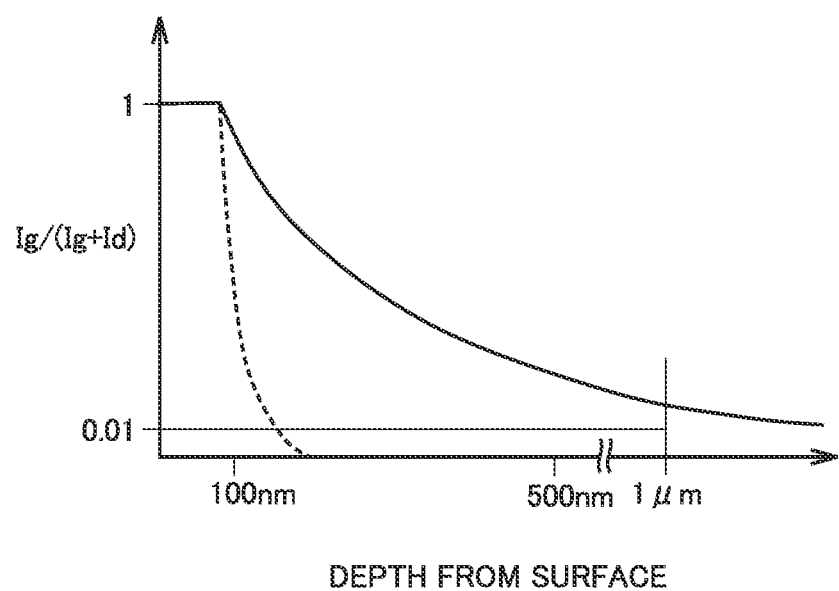
FIG. 1 is a graph showing a change in a ratio (Ig/(Ig+Id)) of graphite to a sum of single crystal diamond or binderless polycrystalline diamond and graphite from a surface of a cutting edge portion (surface of a flank face) toward a depth direction in a diamond cutting tool according to the present embodiment.

Problem to be Solved by the Present Disclosure

The diamond sintered material tool disclosed in PTL 1 has room for improvement in that the precipitated graphite layer is present only on the surface of the flank face, and thus, an increase in wear resistance based on the lubricity of the graphite layer is merely temporary and maintaining the lubricity is required. The diamond-coated cutting tool disclosed in PTL 2 has room for improvement in that a certain amount of the continuous graphite phase is present in the thickness direction, and thus, the lubricity that deals with initial wear is insufficient. Therefore, a diamond cutting tool having the lubricity that deals with initial wear and having the function of maintaining the lubricity to thereby suppress wear of a cutting edge during processing has not yet been achieved, and thus, development of a diamond cutting tool with increased wear resistance is strongly desired.

In view of the above-described circumstances, an object of the present disclosure is to provide a diamond cutting tool with increased wear resistance, and a method for manufacturing the same.

Advantageous Effect of the Present Disclosure

According to the present disclosure, there can be provided a diamond cutting tool with increased wear resistance, and a method for manufacturing the same.

Description of Embodiments of the Present Disclosure

In order to solve the above-described problems, the present inventors conducted earnest studies and accomplished the present disclosure. Specifically, laser processing was performed on a cutting edge portion made of single crystal diamond or binderless polycrystalline diamond in a diamond cutting tool under a prescribed irradiation condition, thereby generating graphite in the cutting edge portion. In this case, the present inventors found that the graphite was present from a surface of the cutting edge portion toward a depth direction to a prescribed depth in the single crystal diamond or the binderless polycrystalline diamond, while decreasing substantially monotonously. The present inventors found that the diamond cutting tool having the graphite in the cutting edge portion had excellent lubricity that can deal with initial wear and had the function of maintaining the lubricity, and thus, accomplished the diamond cutting tool with increased wear resistance.

Aspects of the present disclosure will be first listed below for explanation.

[1] A diamond cutting tool according to an aspect of the present disclosure is a diamond cutting tool including a cutting edge portion containing single crystal diamond or binderless polycrystalline diamond and graphite, wherein when Raman spectroscopy is performed on a surface of the cutting edge portion, a ratio R1 of Ig1 to a sum of Id1 and the Ig1 is equal to or more than 0.5 and equal to or less than 1, where the Id1 represents a peak intensity of first carbon in the surface, the IgM represents a peak intensity of second carbon in the surface, the first carbon represents carbon that forms the single crystal diamond or the binderless polycrystalline diamond, and the second carbon represents carbon that forms the graphite, and when Raman spectroscopy is performed on a plane located at a depth of 1 μm from the surface, a ratio R2 of Ig2 to a sum of Id2 and the Ig2 is equal to or more than 0.01 and equal to or less than 0.3, where the Id2 represents a peak intensity of the first carbon in the plane located at the depth of 1 μm from the surface, and the Ig2 represents a peak intensity of the second carbon in the plane located at the depth of 1 μm from the surface. The diamond cutting tool having such a feature has excellent lubricity that can deal with initial wear and has the function of maintaining the lubricity, and thus, can have increased wear resistance.

[2] Preferably, in the diamond cutting tool, when Raman spectroscopy is performed on a plane located at a depth of 0.5 μm from the surface, a ratio R3 of Ig3 to a sum of Id3 and the Ig3 is lower than the R1 and higher than the R2, where the Id3 represents a peak intensity of the first carbon in the plane located at the depth of 0.5 μm from the surface, and the Ig3 represents a peak intensity of the second carbon in the plane located at the depth of 0.5 μm from the surface. Thus, the wear resistance can be further increased.

[3] Preferably, the surface is a surface of a flank face. Thus, it is possible to provide a diamond cutting tool having excellent lubricity that can deal with initial wear in the flank face and having the function of maintaining the lubricity.

[4] A method for manufacturing a diamond cutting tool according to an aspect of the present disclosure is a method for manufacturing the diamond cutting tool, the method including: preparing the single crystal diamond or the binderless polycrystalline diamond; performing laser processing on the single crystal diamond or the binderless polycrystalline diamond under a first irradiation condition, thereby 1.5 obtaining the cutting edge portion including a cutting edge; and performing laser processing on the cutting edge portion under a second irradiation condition different from the first irradiation condition, thereby generating graphite in the cutting edge portion. According to the method for manufacturing the diamond cutting tool having such a feature, it is possible to manufacture a diamond cutting tool having excellent lubricity that can deal with initial wear and having the function of maintaining the lubricity, and thus, having increased wear resistance.

[5] Preferably, the second irradiation condition is such that a laser wavelength is equal to or more than 532 nm and equal to or less than 1064 nm, a laser spot diameter is equal to or more than 5 μm and equal to or less than 70 μm as a half width, a laser focal depth is equal to or more than 1 mm, a laser output is equal to or more than 1 W and equal to or less than 20 W at a processing point; a laser scan speed is equal to or more than 5 mm/sec and equal to or less than 100 mm/sec, and a laser repetition frequency is equal to or more than 10 Hz and equal to or less than 1 MHz, Thus, the graphite providing the lubricity that can deal with initial wear and the function of maintaining the lubricity to the cutting edge portion can be generated at a good yield.

Details of Embodiments of the Present Disclosure

An embodiment of the present disclosure (hereinafter, also referred to as "the present embodiment") will be described in more detail below with reference to FIG. 1. In the following description, the expression "A to B" represents lower to upper limits of a range (i.e., equal to or more than A and equal to or less than B). When no unit is indicated for A and a unit is indicated only for B, the unit of A is the same as the unit of B.

Diamond Cutting Tool

A diamond cutting tool according to the present embodiment is a diamond cutting tool including a cutting edge portion containing single crystal diamond (hereinafter, also referred to as "SCD") or binderless polycrystalline diamond (hereinafter, also referred to as "BLPCD") and graphite. In the following description, the term "first carbon" may be used for carbon that forms the SCD or the BLPCD, and the term "second carbon" may be used for carbon that forms the graphite.

In the diamond cutting tool, when Raman spectroscopy is performed on a surface of the cutting edge portion, a ratio R1 of Ig1 to a sum of Id1 and the Ig1 is equal to or more than 0.5 and equal to or less than 1, where the Id1 represents a peak intensity of the first carbon in the surface, and the Ig1 represents a peak intensity of the second carbon in the surface. Furthermore, in the diamond cutting tool, when Raman spectroscopy is performed on a plane located at a depth of 1 μm from the surface, a ratio R2 of Ig2 to a sum of Id2 and the Ig2 is equal to or more than 0,01 and equal to or less than 0.3, where the Id2 represents a peak intensity of the first carbon in the plane located at the depth of 1 μm from the surface, and the Ig2 represents a peak intensity of the second carbon in the plane located at the depth of 1 μm from the surface.

When the R1 is equal to or more than 0.5 and equal to or less than 1 and the R2 is equal to or more than 0.01 and equal to or less than 0.3, the diamond cutting tool can obtain excellent lubricity that can deal with initial wear based on graphite in the cutting edge portion, and the function of maintaining the lubricity. Thus, the diamond cutting tool has increased wear resistance, Typically, the diamond cutting tool includes the cutting edge portion having the above-described feature, and a base metal portion to which the cutting edge portion is joined by brazing or the like. The diamond cutting tool may be composed only of the cutting edge portion having the above-described feature. Alternatively, the diamond cutting tool may be configured such that the diamond cutting tool as a whole is made of single crystal diamond or binderless polycrystalline diamond and graphite, and the cutting edge portion has the above-described feature.

In the present embodiment, the diamond cutting tool including the cutting edge portion having the above-described feature and the above-described base metal portion will be described in detail below as one form of diamond cutting tool. However, the present disclosure does not exclude other forms of diamond cutting tools.

<Cutting Edge Portion>

The diamond cutting tool according to the present embodiment includes a cutting edge portion containing SCI) or BLPCD and graphite. The cutting edge portion includes a rake face, a flank face, and a cutting edge formed between the rake face and the flank face. The cutting edge is a portion that is directly involved in processing of a workpiece, and is formed by a part of the rake face, a part of the flank face, and a ridge line where the rake face and the flank face intersect with each other. In the present specification, "rake face" refers to a face ejecting chips produced from a workpiece as the workpiece is cut, and "flank face" refers to a face that faces a cut surface of the workpiece as the workpiece is cut.

The cutting edge portion is a bulk mainly composed of the SCD or the BLPCD, and has a lump shape. Therefore, the cutting edge portion is different in shape from a diamond coating in a diamond-coated tool including a cutting edge formed by covering an arbitrary base member such as cemented carbide with the diamond coating. Furthermore, since the diamond coating and the cutting edge portion in the present embodiment are different in shape from each other, the diamond coating and the cutting edge portion in the present embodiment are different not only in characteristics but also in purpose of use and manufacturing method. This also applies to, for example, the relationship between the diamond-coated tool including the diamond coating containing graphite disclosed in PTL 2 above and the diamond cutting tool including the cutting edge portion according to the present embodiment. When the diamond-coated tool in PTL 2 above and the diamond cutting tool according to the present embodiment are, for example, compared with each other, the diamond-coated tool in PTL 2 above and the diamond cutting tool according to the present embodiment are completely different not only in manufacturing method but also in method for generating graphite in the cutting edge portion.

Furthermore, in the diamond-coated tool, a thickness of the diamond coating is generally approximately 5 to 10 μm, and a thin coating having a thickness of 100 μm or more cannot be substantially manufactured. In contrast, in the diamond cutting tool according to the present embodiment, it is easy to cause the SCD or the BLPCD that forms the cutting edge portion to have a thickness of 100 μm or more.

(SCD and BLPCD)

The cutting edge portion contains the SCD or the BLPCD. The SCD can be prepared by performing a conventionally known manufacturing method such as a high pressure high temperature (HPHT) method or a chemical vapor deposition (CVD) method. The BLPCD is polycrystalline diamond in which diamond particles are bonded to each other without a binder (bonding material). The BLPCD can be prepared by converting graphite as a starting material into diamond particles in accordance with the conventionally known HPHT method, and at the same time, sintering and bonding the diamond particles without using the bonding material. Particularly, the SCD and the BLPCD prepared as the cutting edge portion preferably have a light (laser beam) absorption coefficient of equal to or more than 3 cm$^{-1}$ and less than 10 cm$^{-1}$ with respect to a laser wavelength used in a second irradiation condition described below. Thus, the cutting edge portion that provides the effect of the present disclosure can be formed efficiently.

The light (laser beam) absorption coefficient of the SCD and the BLPCD can be calculated by using the following measurement method. First, plate-shaped SCD or BLPCD having a specified thickness is prepared by using, for example, a below-described method for manufacturing a diamond cutting tool as appropriate. Next, a light transmittance T of the SCD or the BLPCD with respect to a wavelength (e.g., 532 nm or 1064 nm) of the laser beam is measured by ultraviolet-visible spectroscopy. Light transmittance T herein refers to a ratio ($I/I_0$) between an incident light intensity $I_0$ to an object and a transmitted light intensity I of the object. The ratio ($I/I_0$) can be expressed by the equation of "$I/I_0=T=(1-R)^2 \times \exp(-\alpha L)$", where L represents a thickness of the object, R represents a light reflectance specific to the object, and α represents a light absorption coefficient. Therefore, by substituting light transmittance $T(=I/I_0)$ measured for the SCD or the BLPCD, thickness L of the SCD or the BLPCD, and light reflectance R (in the case of diamond, R=0.172) specific to the object into the above-described equation, light absorption coefficient α can be calculated. From the above, whether or not the SCD or the BLPCD has the light absorption coefficient of equal to or more than 3 cm$^{-1}$ and less than 10 cm$^{-1}$ with respect to the laser wavelength used in the second irradiation condition described below can be determined by calculating light absorption coefficient α based on the above-described equation.

In the SCD and the BLPCD, a content of impurity elements other than carbon is preferably equal to or less than 1 mass %, The content of the impurity elements is more preferably equal to or less than 0.5 mass %. The impurity elements may be one or more metal elements selected from the group consisting of a rare earth element, an alkaline earth metal, Co, Fe, Ni, Ti, W, Ta, Cr, and V. Furthermore, the impurity elements may also be one or more non-metal elements or semimetal elements selected from the group consisting of nitrogen, oxygen, boron, silicon, and hydrogen. In the SCD and the BLPCD, the content of the impurity elements may be 0 mass %.

A method for measuring the content of the impurity elements is as follows. Specifically, by using secondary ion mass spectrometry (SIMS), a secondary ion intensity (counts/sec) of the impurity elements to be measured in the SCD or the BLPCD prepared as the cutting edge portion is first measured. Furthermore, based on the measurement result, spectrum data of the impurity elements is obtained. The spectrum data is created as a graph in which the horizontal axis represents an analysis depth and the vertical axis represents a secondary ion intensity. Next, a reference sample is prepared by ion implantation of the impurity elements to be measured into the SCD or the BLPCD at known energy (key) and dose amount (atones/cm$^2$). Furthermore a secondary ion intensity of the reference sample is measured under the same condition as that of the measurement performed on the SCD or the BLPCD, and spectrum data of the impurity elements in the reference sample is obtained. Finally, the spectrum data of the impurity elements in the SCD or the BLPCD is compared with the spectrum data of the impurity elements in the reference sample, and thus, a content (atoms/cm$^3$) of the impurity elements to be measured in the SCD or the BLPCD can be calculated.

The SCD and the BLPCD having a light (laser beam) absorption coefficient of equal to or more than 3 cm$^{-1}$ and less than 10 cm$^{-1}$ with respect to the laser wavelength used in the second irradiation condition are obtained at a good yield when the content of the impurity elements other than carbon is equal to or less than 1 mass %. The SCD and the BLPCD in which the content of the impurity elements other than carbon is equal to or less than 1 mass % can be obtained by using the conventionally known manufacturing method.
(Graphite)

The cutting edge portion contains graphite as described above. As described in detail in the section of [Method for Manufacturing Diamond Cutting Tool] below, the graphite can be generated by performing laser processing on the SCD or the BLPCD under a first irradiation condition to thereby obtain a cutting edge portion including a cutting edge, and then, performing laser processing on the cutting edge portion under a second irradiation condition different from the first irradiation condition.

FIG. 1 is a graph showing a change in a ratio of the graphite to a sum of the SCD or the BLPCD and the graphite from the surface of the cutting edge portion toward a depth direction in the diamond cutting tool according to the present embodiment. As shown in FIG. 1, in the cutting edge portion, the graphite is present at least from the surface of the cutting edge portion toward the depth direction to a plane located at a depth of 1 μm from the surface of the cutting edge portion in the SCD or the BLPCD, while decreasing substantially monotonously. Thus, the lubricity that can deal with initial wear based on graphite and the function of maintaining the lubricity can be provided to the cutting edge portion and thus, the wear resistance of the diamond cutting tool can be increased. In the present embodiment, the change in the ratio of the graphite as shown in FIG. 1 can be obtained as a ratio ($R=Ig/(Ig+Id)$) of the graphite to the sum of the SCD or the BLPCD and the graphite in the cutting edge portion, based on Raman spectroscopy described below.

In contrast, a change in a ratio of graphite shown by a broken line in FIG. 1 indicates the case of actively precipitating a graphite layer (hereinafter, also referred to as "conventional graphite layer") on a cutting edge portion by conventionally known laser processing or the like in this type of diamond cutting tool. In this case, the conventional graphite layer is thin and has a thickness of approximately 100 nm. Therefore, in FIG. 1, the ratio of the graphite in the cutting edge portion having the conventional graphite layer decreases steeply when a depth of 100 nm from the surface of the cutting edge portion is exceeded. Thus, in the diamond cutting tool having the conventional graphite layer, the effect based on the lubricity of the graphite is temporary and it is difficult to maintain the lubricity during processing.

Figure 2:
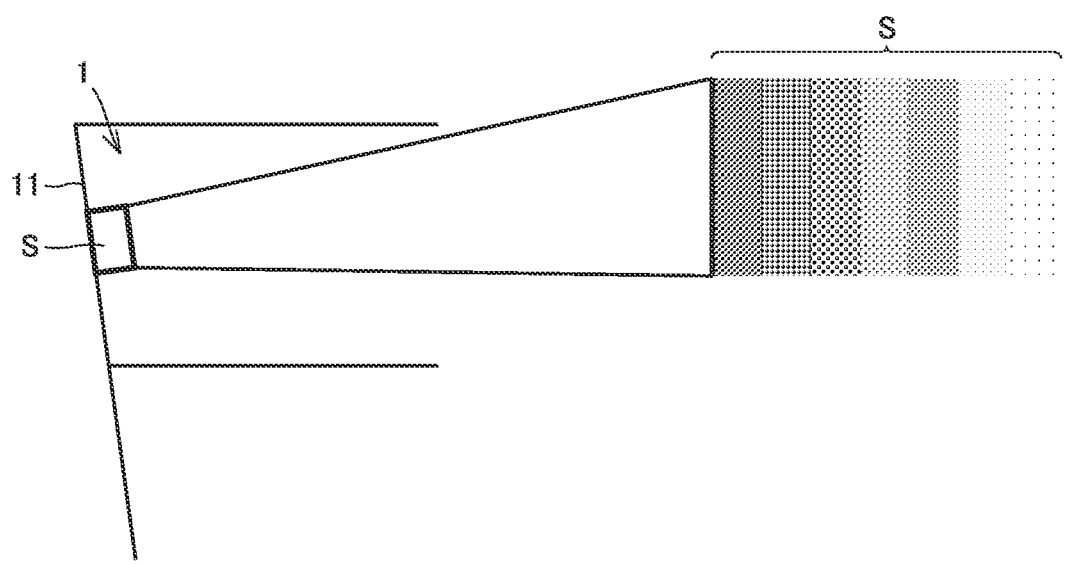
FIG. 2 is an explanatory diagram showing the change in the ratio of graphite from the surface of the cutting edge portion toward the depth direction in the diamond cutting tool according to the present embodiment shown in the graph in FIG. 1, by schematically reflecting the change in the ratio of graphite on a cross section obtained by cutting a part of the cutting edge portion (a part, of the flank face) from a surface thereof in the depth direction.

Furthermore, FIG. 2 is an explanatory diagram showing the change in the ratio of the graphite from the surface of the cutting edge portion toward the depth direction in the diamond cutting tool according to the present embodiment shown in the graph in FIG. 1, by schematically reflecting the change in the ratio of the graphite on a cross section obtained by cutting a part of the cutting edge portion (a part of the flank face) from a surface thereof in the depth direction. Specifically, FIG. 2 shows the change in the ratio of the graphite by gradation of gray color (density of dots) in an enlarged view of a cross section S obtained by cutting a part of cutting edge portion 1 of the diamond cutting tool from the surface (surface of flank face 11) in the depth direction. That is, the ratio of the graphite is higher in a region of cross section S having a darker gray color indicated by dense dots. According to FIG. 2, it is understood that although the ratio (content) of the graphite decreases substantially monotonously from the surface of flank face 11 toward the depth direction in cross section S, the graphite is present at least from the surface of flank face 11 to a prescribed depth without becoming zero.

In the present specification, "surface of the cutting edge portion" refers to a surface of the rake face, a surface of the flank face, and a surface of the cutting edge. However, from the perspective of sufficiently providing the effect of the present disclosure, "surface of the cutting edge portion" to be analyzed by Raman spectroscopy described below is preferably the surface of the flank face. This is because the flank face is a face that faces a cut surface of a workpiece as the workpiece is cut, and thus, the flank face is required to have more excellent wear resistance than the rake face. This is also because a region where Raman spectroscopy can be performed is larger in the flank face than in the cutting edge, and thus, it is easier to use the flank face as an analysis target than the cutting edge. That is, the surface is preferably the surface of the flank face. Furthermore, in the present specification, "surface" in "surface of the cutting edge portion" refers to an outermost surface of the cutting edge portion and does not include the concept of thickness in the depth direction.

(R1, R2 and R3 Calculated by Raman Spectroscopy)

In the diamond cutting tool according to the present embodiment, when Raman spectroscopy is performed on the surface of the cutting edge portion, a ratio R1 of Ig1 to a sum of Id1 and the Ig1 is equal to or more than 0.5 and equal to or less than 1, where the Id1 represents a peak intensity of first carbon in the surface, the represents a peak intensity of second carbon in the surface, the first carbon represents carbon that forms the SCD or the BLPCD, and the second carbon represents carbon that forms the graphite: The R1 refers to the ratio of the graphite to the sum of the SCD or the BLPCD and the graphite in the surface of the cutting edge portion, and can be expressed by the equation of $Ig1/(Ig1+Id1)$. That is, in the present embodiment, the ratio ($R1=Ig1/(Ig1+Id1)$) of the graphite to the sum of the SCD or the BLPCD and the graphite in the surface of the cutting edge portion is equal to or more than 0.5 and equal to or less than 1.

The R1 is preferably equal to or more than 0.7 and equal to or less than 1, and more preferably equal to or more than 0.9 and equal to or less than 1. When the R1 is less than 0.5, the ratio of the graphite in the surface of the cutting edge portion is very low, which makes it difficult to obtain the lubricity that can deal with initial wear. In contrast, according to the equation of $Ig1/(Ig1+Id1)$, the R1 never exceeds 1.

Furthermore, when Raman spectroscopy is performed on a plane located at a depth of 1 μm from the surface of the cutting edge portion, a ratio R2 of Ig2 to a sum of Id2 and the Ig2 is equal to or more than 0.01 and equal to or less than 0.3, where the Id2 represents a peak intensity of the first carbon in the plane located at the depth of 1 μm from the surface, and the Ig2 represents a peak intensity of the second carbon in the plane located at the depth of 1 μm from the surface. The R2 refers to the ratio of the graphite to the sum of the SCD or the BLPCD and the graphite in the plane located at the depth of 1 μm from the surface of the cutting edge portion, and can be expressed by the equation of $Ig2/(Ig2+Id2)$. That is, in the present embodiment, the ratio ($R2=Ig2/(Ig2+Id2)$) of the graphite to the sum of the SCD or the BLPCD and the graphite in the plane located at the depth of 1 μm from the surface of the cutting edge portion is equal to or more than 0.01 and equal to or less than 0.3. In the present specification, "plane located at the depth of 1 μm from the surface of the cutting edge portion" refers to a plane that is spaced apart from the surface of the cutting edge portion in the depth direction by 1 μm and is parallel to the surface. In addition, "plane located at the depth of 1 μm from the surface of the cutting edge portion" refers to a plane (measurement target plane) set virtually to perform Raman spectroscopy, and is exposed at the time of Raman spectroscopy as described below.

The R2 is preferably equal to or more than 0.1 and equal to or less than 0.3, and more preferably equal to or more than 0.15 and equal to or less than 0.25. When the R2 is less than 0.01, the ratio of the graphite in the plane located at the depth of 1 μm from the surface of the cutting edge portion is very low, which makes it difficult to maintain the lubricity during processing. When the R2 exceeds 0.3, the ratio of the graphite in the plane located at the depth of 1 μm from the surface of the cutting edge portion is excessive, which makes it difficult to obtain the sufficient processing performance due to a decrease in hardness.

The reason why the ratio of the graphite to the sum of the SCD or the BLPCD and the graphite in the plane located at the depth of 1 μm from the surface of the cutting edge portion is defined as the R2 in the present embodiment is as follows. Specifically, processing of a difficult-to-cut workpiece to which this type of diamond cutting tool is applied is called "mirror processing" or the like, and it is often requested to finish the workpiece into a processed surface having a very small surface roughness. In this case, when the diamond cutting tool is used for processing of the workpiece to such an extent that the plane located at the depth of 1 μm from the surface of the cutting edge portion is exposed, it is generally determined that the diamond cutting tool has reached the end of its life. Therefore, by defining the R2, it can be made clear whether or not the lubricity is maintained until it is determined that the diamond cutting tool has reached the end of its life.

When the diamond cutting tool according to the present embodiment has the above-described relationship of the R1 and the R2, i.e., when the R1 is equal to or more than 0.5 and equal to or less than 1 and the R2 is equal to or more than 0.01 and equal to or less than 0.3, the excellent lubricity that can deal with initial wear based on graphite in the cutting edge portion and the function of maintaining the lubricity can be obtained.

Specifically, first, since the ratio (R1) of the graphite in the surface of the cutting edge portion is equal to or more than 0.5 and equal to or less than 1, the lubricity that can deal with initial wear can be obtained. This is because the graphite forms a majority in the surface of the cutting edge portion.

Furthermore, since the ratio (R2) of the graphite in the plane located at the depth of 1 μm from the surface of the cutting edge portion is equal to or more than 0.01 and equal to or less than 0.3, the excellent processing performance can be achieved. This is because the SCD or the BLPCD having a high hardness forms a majority in the plane located at the depth of 1 μm from the surface of the cutting edge portion. In addition, since the graphite is present in the plane located at the depth of 1 μm from the surface of the cutting edge portion, the lubricity can also be maintained.

Next, when Raman spectroscopy is performed on a plane located at a depth of 0.5 μm from the surface of the cutting edge portion of the diamond cutting tool, a ratio R3 of Ig3 to a sum of Id3 and the Ig3 is preferably lower than the R1 and higher than the R2, where the Id3 represents a peak intensity of the first carbon in the plane located at the depth of 0.5 μm from the surface, and the Ig3 represents a peak intensity of the second carbon in the plane located at the depth of 0.5 μm from the surface. The R3 refers to a ratio of the graphite to a sum of the SCD or the BLPCD and the graphite in the plane located at the depth of 0.5 μm from the surface of the cutting edge portion, and can be expressed by the equation of Ig3/(Ig3+Id3). That is, in the present embodiment, the ratio (R3=Ig3/(Ig3+Id3)) of the graphite to the sum of the SCD or the BLPCD and the graphite in the plane located at the depth of 0.5 μm from the surface of the cutting edge portion is preferably lower than the R1 and higher than the R2. In other words, the diamond cutting tool according to the present embodiment preferably satisfies the relationship of R1>R3>R2. In the present specification, "plane located at the depth of 0.5 μm from the surface of the cutting edge portion" refers to a plane that is spaced apart from the surface of the cutting edge portion in the depth direction by 0.5 μm and is parallel to the surface. In addition, "plane located at the depth of 0.5 μm from the surface of the cutting edge portion" refers to a plane (measurement target plane) set virtually to perform Raman spectroscopy, and is exposed at the time of Raman spectroscopy as described below.

The diamond cutting tool satisfies the relationship of R1>R3>R2, which means that a significant amount of graphite is present in the SCD or the BLPCD in the plane located at the depth of 0.5 μm from the surface of the cutting edge portion, and thus, the lubricity can be maintained. Furthermore, since the SCD or the BLPCD forms a majority in the plane located at the depth of 0.5 μm from the surface of the cutting edge portion, the excellent processing performance can also be achieved. However, when the R3 is higher than the R1, the ratio of the graphite in the plane located at the depth of 0.5 μm from the surface of the cutting edge portion is excessive, which may make it impossible to obtain the sufficient processing performance due to a decrease in hardness. When the R3 is higher than the R1, the ratio of the graphite in the surface 1.0 μm of the cutting edge portion is very low, which may make it difficult to obtain the lubricity that can deal with initial wear.

Furthermore, when the R3 is lower than the R2, the ratio of the graphite in the plane located at the depth of 0.5 μm from the surface of the cutting edge portion is very low, which may make it impossible to maintain the lubricity during processing. When the R3 is lower than the R2, the ratio of the graphite in the plane located at the depth of 1 μm from the surface of the cutting edge portion is excessive, which may make it impossible to obtain the sufficient processing performance due to a decrease in hardness. Specifically, the R3 is preferably equal to or more than 0.1 and equal to or less than 0.75and more preferably more than 0.3 and less than 0.5.

Specifically, the diamond cutting tool including the cutting edge portion that satisfies the above-described relationship of R1>R3>R2 is obtained by the below-described method for manufacturing the diamond cutting tool. In view of the contents of the manufacturing method, it is estimated that in the cutting edge portion, the graphite is present at least from the surface of the cutting edge portion toward the depth direction to the plane located at the depth of 1 μm from the surface of the cutting edge portion in the SCD or the BLPCD, while decreasing substantially monotonously, as shown in FIGS. 1 and 2. Therefore, in the present specification, when the ratio of the graphite satisfies the relationship of R1>R3>R2 in the cutting edge portion, the graphite is regarded as, in the cutting edge portion, being "present at least from the surface of the cutting edge portion toward the depth direction to the plane located at the depth of 1 μm from the surface of the cutting edge portion in the SCD or the BLPCD, while decreasing substantially monotonously". Therefore, as long as the ratio of the graphite satisfies the above-described relationship of R1>R3>R2, even if there is a portion having a constant ratio of the graphite from the surface of the cutting edge portion toward the depth direction and even if there is a portion having an increasing ratio of the graphite from the surface of the cutting edge portion toward the depth direction, these do not depart from the diamond cutting tool according to the present embodiment, as long as these provide the effect of the present disclosure.

The ratios (R1, R2 and R3) of the graphite can be calculated by performing Raman spectroscopy in accordance with the following procedure. First, as to the R1, a diamond cutting tool is obtained based on, for example, the below-described method for manufacturing the diamond cutting tool, to thereby prepare a sample to be measured. Next, Raman spectroscopy is performed by irradiating a surface of a cutting edge portion (surface of a flank face) in the sample with a laser beam having a wavelength of 532 nm as excitation light at room temperature. In the Raman spectroscopy, based on a phonon peak obtained by performing spectrum analysis using a spectrometer (product name: "LabRAM RR UV-VIS NM" manufactured by HORIBA, Ltd.) having a wavenumber resolution of 0.25 $cm^{-1}$ or less, a composite function of a Lorentz function and a Gaussian function is fitted using a least-square method, to thereby obtain peak intensities of diamond and graphite. Specifically, a peak intensity (Id1) of diamond that appears around 1333 $cm^{-1}$ and a peak intensity (Ig1) of graphite that appears around 1400 to 1700 $cm^{-1}$ are measured. Based on these Id1 and Ig1 the R1 can be calculated from the equation of Ig1/(Ig1+Id1). The R1 can be calculated by obtaining Ig1/(Ig1+Id1) at arbitrary five locations on the flank face and taking an average thereof.

Next, the R2 can be calculated by using the following method. First, the flank face of the cutting edge portion in the sample is polished to expose a plane located at a depth of 1 μm from the surface of the cutting edge portion, and this exposed plane serves as a measurement target plane. By performing Raman spectroscopy on the measurement target plane in accordance with the same method as the method for calculating the R1, the R2 can be calculated from the equation of Ig2/(Ig2+Id2). As to the R3 as well, the flank face of the cutting edge portion in the sample is polished to expose a plane located at a depth of 0.5 μm from the surface of the cutting edge portion, and by performing Raman spectroscopy on this exposed plane serving as a measurement target plane in accordance with the same method as the method for calculating the R1, the R3 can be calculated from the equation of Ig3/(Ig2+Id2). It is preferable to calculate the numerical values of the R1, the R3 and the R2 in this order when performing the Raman spectroscopy.

<Other Component in Diamond Cutting Tool: Base Metal Portion>

The diamond cutting tool may include the base metal portion in addition to the cutting edge portion as described above. As the base metal portion of the diamond cutting tool, any base metal portion conventionally known as a base metal portion of this type can be used. For example, the base metal portion is preferably made of any of cemented carbide (including, for example, WC-based cemented carbide, cemented carbide containing WC and. Co, and cemented carbide containing WC and Co and additionally carbonitride of Ti, Ta, Nb or the like), cermet (having a main component such as TiC, TiN, TiCN or the like), high-speed steel, a ceramic material (such as titanium carbide, silicon carbide, silicon nitride, aluminum nitride, aluminum oxide, or the like), a cubic, boron nitride sintered material, and a diamond sintered material.

Among these, the cemented carbide (particularly WC-based cemented carbide), or the cermet (particularly TiCN-based cermet) is preferably selected as the material of the base metal portion. These materials are excellent in balance between hardness and strength at high temperature, and have excellent characteristics for the base metal portion of the diamond cutting tool for the above-described use. When WC-based cemented carbide is used for the base metal portion, its structure may include free carbon and/or a deficient layer called η phase or ε phase.

The surface of the base metal portion may be modified. For example, the base metal portion of cemented carbide may have a surface in which a β-free layer is formed, and the base metal portion of cermet may have a surface-hardened layer, Even when the surface of the base metal portion is modified, the desired effect is still exhibited.

When the diamond cutting tool is a cutting tool such as a drill, the base metal portion may be called "shank".

<Uses of Diamond Cutting Tool>

The diamond cutting tool can be used not only as the above-described drill but also as various types of cutting tools such as an end mill (e.g., a ball end mill), a cutting edge-replaceable cutting tip for drill, a cutting edge-replaceable cutting tip for end mill, a cutting edge-replaceable cutting tip for milling, a cutting edge-replaceable cutting tip for turning, a metal saw, a gear-cutting tool, a reamer, and a tap.

<Function>

In the diamond cutting tool according to the present embodiment, the graphite is present at least from the surface of the cutting edge portion toward the depth direction to the plane located at the depth of 1 μm from the surface of the cutting edge portion in the SCD or the BLPCD, while decreasing substantially monotonously. Thus, the lubricity that can deal with initial wear based on graphite and the function of maintaining the lubricity can be provided to the cutting edge portion, and thus, the wear resistance of the diamond cutting tool can be increased.

[Method for Manufacturing Diamond Cutting Tool]

A conventionally known method for manufacturing this type of diamond cutting tool can be used as appropriate as the method for manufacturing the diamond cutting tool according to the present embodiment, except for a third step described below. Specifically, according to the above-described method for manufacturing the diamond cutting tool, as a result of the third step described below, the graphite is generated in the cutting edge portion at least from the surface of the cutting edge portion toward the depth direction to the plane located at the depth of 1 μm from the surface of the cutting edge portion in the SCD or the BLPCD, while decreasing substantially monotonously, and thus, the diamond cutting tool with increased wear resistance can be obtained. Specifically, from the perspective of obtaining the diamond cutting tool at a good yield, the following method is preferably used as the method for manufacturing the diamond cutting tool according to the present embodiment.

The method for manufacturing the diamond cutting tool according to the present embodiment is a method for manufacturing the diamond cutting tool, the method including: preparing the SCD or the BLPCD (first step); performing laser processing on the SCD or the BLPCD under a first irradiation condition, thereby obtaining the cutting edge portion including a cutting edge (second step); and performing laser processing on the cutting edge portion under a second irradiation condition different from the first irradiation condition, thereby generating graphite in the cutting edge portion (third step).

<First Step>

This step is a step of preparing the SCD or the BLPCD. Both the SCD and the BLPCI) can be prepared by using a conventionally known manufacturing method for obtaining these. For example, the SCD can be prepared by using the conventionally known HTHP method the conventionally known CVD method or the like. Furthermore, the BLPCD can be prepared by sintering and converting graphite as a starting material into diamond particles in accordance with the conventionally known HTHP method, and at the same time, bonding the diamond particles to each other. When the diamond cutting tool is, for example, a cutting edge-replaceable cutting tip for turning, the SCI) and the BLPCD are preferably prepared to have a chip shape having a length of 2 to 6 mm, a width of 1 to 6 min, and a thickness of 0.3 to 2 mm. When the diamond cutting tool is, for example, a drill, the SCD and the BLPCD are preferably prepared to have a cylindrical shape having a length of 0.5 to 5 mm and a diameter of 0,5 to 5 mm.

As described above, the SCD and the BLPCD can be obtained by using the conventionally known manufacturing method. However, from the perspective of sufficiently providing the effect of the present disclosure, the SCD and the BLPCD having a light absorption coefficient of equal to or more than 3 $cm^{-1}$ and less than 10 $cm^{-1}$ with respect to a laser wavelength used in the second irradiation condition described below are preferably selected and prepared, of the SCD and the BLPCD obtained by using the conventionally known manufacturing method.

This step preferably includes a step of joining the SCD or the BLPCD to the base metal portion by brazing or the like (base metal portion joining step). The base metal portion can be prepared from the conventionally known material such as cemented carbide as described above. For example, IGETALLOY (registered trademark material type: G10E, AFU or the like) manufactured by Sumitomo Electric Industries, Ltd. can be suitably used as the material of the base metal portion. The shape of the base metal portion can be formed to correspond to the shape of the SCD and the BLPCD. Instead of performing the base metal portion joining step in this step, the base metal portion joining step can also be performed after the below-described third step of generating graphite in the cutting edge portion.

<Second Step>

This step is a step of performing laser processing on the SCD or the BLPCD under a first irradiation condition, thereby obtaining the cutting edge portion including a cutting edge. Specifically, first, the SCD or the BLPCD is attached to a conventionally known laser processing machine (e.g., product name "PreCutter" manufactured by Laser Plus Co.). Furthermore, the surface of the SCD or the BLPCD is scanned and processed with a laser beam of the laser processing machine under the first irradiation condition, thereby forming a cutting edge on the SCD or the BLPCD. Thus, the cutting edge portion including the cutting edge can be obtained.

A conventionally known condition can be used as the first irradiation condition. For example, the first irradiation condition can be such that a laser wavelength is equal to or more than 532 nm and equal to or less than 1064 nm, a laser spot diameter is equal to or more than 5 µm and equal to or less than 70 µm as a half width, a laser focal depth is equal to or more than 0.5 mm and equal to or less than 20 mm, a laser output is equal to or more than 1 W and equal to or less than 20 W at a processing point, and a laser scan speed is equal to or more than 5 mm/sec and equal to or less than 100 mm/sec.

<Third Step>

This step is a step of performing laser processing on the cutting edge portion under a second irradiation condition different from the first irradiation condition, thereby generating graphite in the cutting edge portion. Specifically, first, the cutting edge portion is attached to the above-described laser processing machine or a second laser processing machine different from the above-described laser processing machine. Next, the surface of the cutting edge portion is scanned and processed with a laser beam of the above-described laser processing machine or the second laser processing machine under the second irradiation condition, thereby generating graphite in the cutting edge portion.

The second irradiation condition is preferably such that a laser wavelength is equal to or more than 532 nm and equal to or less than 1064 nm, a laser spot diameter is equal to or more than 5 µm and equal to or less than 70 µm as a half width, a laser focal depth is equal to or more than 1 mm, a laser output is equal to or more than 1 W and equal to or less than 20 W at a processing point, and a laser scan speed is equal to or more than 5 mm/sec and equal to or less than 100 mm/sec. The second irradiation condition is more preferably such that a laser wavelength is 532 nm or 1064 nm, a laser spot diameter is 10 to 50 µm as a half width, a laser focal depth is equal to or more than 1.5 mm, a laser output is 2 to 10 W. and a laser scan speed is 30 to 100 mm/min. Although the upper limit of the laser focal depth is not particularly limited, the upper limit of the laser focal length can be equal to or less than 20 mm. A laser pulse width is preferably equal to or more than 1 f (femto) second and equal to or less than 1 microsecond. A laser repetition frequency is preferably equal to or more than 10 Hz and equal to or less than 1 MHz.

When the laser spot diameter is less than 5 µm as a half width in the second irradiation condition, it tends to be difficult to form such a profile that the graphite is present from the surface of the cutting edge portion toward the depth direction to the prescribed depth in the SCD or the BLPCD, while decreasing substantially monotonously, because the laser power is low. When the laser spot diameter exceeds 70 µm as a half width, the SCI) or the BLPCD tends to be broken because the laser power is high. When the laser focal depth is less than 1 mm, it tends to be difficult to form such a profile that the graphite is present up to the prescribed depth in the SCD or the BLPCD, while decreasing substantially monotonously, because of defocusing. When the laser output is less than 1 W at the processing point, it tends to be difficult to form such a profile that the graphite is present from the surface of the cutting edge portion toward the depth direction to the prescribed depth in the SCD or the BLPCD, while decreasing substantially monotonously, because the laser power is low. When the laser output exceeds 20 W at the processing point, the SCD or the BLPCI) tends to be broken because the laser power is high.

When the laser scan speed is less than 5 mm/sec, the SCD or the BLPCD tends to be broken because the laser beam enters the SCD or the BLPCD too deeply. When the laser scan speed exceeds 100 mm/sec, laser processing tends to be hardly performed. When the laser pulse width is less than 1 femtosecond, the SCD or the BLPCD tends to be broken because the laser power is high. When the laser pulse width exceeds 1 microsecond the SCD or the BLPCD tends to be broken because thermal processing becomes predominant. When the laser repetition frequency is less than 10 Hz, the SOD or the BLPCD tends to be broken because thermal processing becomes predominant. When the laser repetition frequency exceeds 1 MHz, it tends to be difficult to form such a profile that the graphite is present from the surface of the cutting edge portion toward the depth direction to the prescribed depth in the SCD or the BLPCD, while decreasing substantially monotonously, because a next laser pulse arrives before the energy of the applied laser pulse is consumed at the processing point, and thus, a thermal load at the processing point is large.

In this step, laser processing is preferably performed under the second irradiation condition on the cutting edge portion made of the SCD or the BLPCD having a light absorption coefficient of equal to or more than 3 $cm^{-1}$ and less than 10 $cm^{-1}$ with respect to the laser wavelength used in the second irradiation condition. In this case, the laser beam travels from the surface of the cutting edge portion in the depth direction, and thus, can enter the cutting edge portion. When the laser beam having entered the cutting edge portion has energy that exceeds a threshold value at which diamond is graphitized in the laser beam entering region, the laser beam can graphitize the SCD or the BLPCD in the region.

However, as the laser beam travels from the surface of the cutting edge portion in the depth direction more deeply, more energy of the laser beam is lost. Therefore as the laser beam travels from the surface of the cutting edge portion in the depth direction more deeply, the laser beam becomes unable to graphitize the SCD or the BLPCD in the region. This can be graphically shown as the change in the ratio of the graphite to the sum of the SCD or the BLPCD and the graphite as shown in FIG. 1.

The first irradiation condition under which laser processing is performed on the SCD or the BLPCD and the second irradiation condition under which laser processing is performed on the cutting edge portion include overlapping ranges about various parameters. However, as long as laser processing is performed under the condition different from the first irradiation condition in this step, the effect of the present disclosure can be provided. This is because the first irradiation condition is for laser processing that forms the cutting edge portion including the cutting edge from the bulk-shaped SCD or BLPCD, whereas the second irradiation condition is for laser processing that generates the graphite from the surface of the cutting edge portion toward the depth direction at the prescribed ratio, and thus, the energy of the laser beam is differently used in the irradiated portion (the SCD or the BLPCD, or the cutting edge portion). Specifically, in laser processing under the first irradiation condition, a plane that is substantially perpendicular to the laser beam is the main irradiated portion, and thus, the power density is relatively high. In contrast, in laser processing under the second irradiation condition, a plane that is substantially horizontal to the laser beam is the main irradiated portion, and thus, the power density is relatively low.

<Function and Effect>

The diamond cutting tool according to the present embodiment can be obtained by using the above-described manufacturing method. In the diamond cutting tool obtained by using the above-described manufacturing method, laser processing is performed on the cutting edge portion made of the SCD or the BLPCD under the second irradiation condition, and thus, in the cutting edge portion, the graphite can be present at least from the surface of the cutting edge portion toward the depth direction to the plane located at the depth of 1 μm from the surface of the cutting edge portion in the SCD or the BLPCD, while decreasing substantially monotonously. Therefore, according to the above-described manufacturing method, it is possible to obtain a diamond cutting tool having excellent lubricity that can deal with initial wear based on the graphite and having the function of maintaining the lubricity, and thus, having increased wear resistance.

CLAUSES

The above description includes embodiments additionally described below.

Clause 1

A diamond cutting tool comprising a cutting edge portion containing single crystal diamond or binderless polycrystalline diamond and graphite, wherein when Raman spectroscopy is performed on a surface of the cutting edge portion, a ratio R1 of Ig1 to a sum of Id1 and the Ig2 is equal to or more than 0.5 and equal to or less than 1, where the Id1 represents a peak intensity of first carbon in the surface, the represents a peak intensity of second carbon in the surface, the first carbon represents carbon that forms the single crystal diamond or the binderless polycrystalline diamond, and the second carbon represents carbon that forms the graphite, and when Raman spectroscopy is performed on a plane located at a depth of 1 μm from the surface, a ratio R2 of Ig2 to a sum of Id2 and the Ig2 is equal to or more than 0.01 and equal to or less than 0.3, where the Id2 represents a peak intensity of the first carbon in the plane located at the depth of 1 μm from the surface, and the Ig2 represents a peak intensity of the second carbon in the plane located at the depth of 1 μm from the surface.

Clause 2

The diamond cutting tool according to Clause 1, wherein the R1 is equal to or more than 0.7 and equal to or less than 1.

Clause 3

The diamond cutting tool according to Clause 1 or 2, wherein the R1 is equal to or more than 0.9 and equal to or less than 1.

Clause 4

The diamond cutting tool according to any one of Clauses 1 to 3, wherein the R2 is equal to or more than 0.1 and equal to or less than 0.3.

Clause 5

The diamond cutting tool according to any one of Clauses 1 to 4, wherein the R2 is equal to or more than 0.15 and equal to or less than 0.25.

Clause 6

The diamond cutting tool according to any one of Clauses 1 to 5, wherein when Raman spectroscopy is performed on a plane located at a depth of 0.5 μm from the surface, a ratio R3 of Ig3 to a sum of Id3 and the Ig3 is equal to or more than 0.1 and equal to or less than 0.75, where the Id3 represents a peak intensity of the first carbon in the plane located at the depth of 0.5 μm from the surface, and the Ig3 represents a peak intensity of the second carbon in the plane located at the depth of 0.5 μm from the surface.

Clause 7

The diamond cutting tool according to any one of Clauses 1 to 6, wherein the R3 is more than 0.3 and less than 0.5.

Clause 8

The diamond cutting tool according to any one of Clauses 1 to 7, wherein the single crystal diamond or the binderless polycrystalline diamond has a light absorption coefficient of equal to or more than 3 $cm^{-1}$ and less than 10 $cm^{-1}$ with respect to a laser wavelength of 1064 nm or 537 nm.

EXAMPLES

Although the present disclosure will be described in more detail below with reference to Examples, the present disclosure is not limited to these Examples. In each of Examples and. Comparative Examples described below, two diamond cutting tools were manufactured. Furthermore, in each of Examples and Comparative Examples, one of the two diamond cutting tools was used for measurement of a surface roughness Ra of a flank face and a cutting test, and the other was used for measurement of the ratios (R1, R2 and R3 of graphite in SCD or BLPCD in a cutting edge portion.

Manufacturing of Diamond Cutting Tool

Example 1

First Step

A bulk of BLPCD used to produce a chip shape of CCMW09717304 defined by the ISO (International Organization for Standardization) was prepared by using the conventionally known HTHP method. The BLPCD was joined by brazing, to a base metal portion formed by processing cemented carbide (IGETALLOY (registered trademark, material type: G10E) manufactured by Sumitomo Electric Industries, Ltd.), and a material to be used in a second step described below was thus produced. A light absorption coefficient of the BLPCD with respect to a laser wavelength of 1064 nm was calculated using the above-described measurement method and the result was 3 $cm^{-1}$.

Second Step

A surface of the BLPCD in the material was scanned and laser-processed with a laser beam under a first irradiation condition described below, using a processing machine of equivalent performance to that of the above-described laser processing machine. As a result, a cutting edge portion including a rake face, a flank face, and a cutting edge formed between the rake face and the flank face was formed on the BLPCD, and a diamond cutting tool precursor to be used in a third step described below was thus obtained.

The first irradiation condition was as follows:
laser wavelength: 1064 nm
laser spot diameter: 50 μm (half width)
laser focal depth: 1.5 μm
laser output: 10 W (processing point)
laser scan speed: 50 mm/min.

Third Step

The cutting edge portion of the diamond cutting tool precursor was scanned and laser-processed with a laser beam under a second irradiation condition described below, using the above-described laser processing machine. As a result, graphite was generated in the cutting edge portion, and a diamond cutting tool (cutting edge-replaceable cutting tip for turning) according to Example 1 was thus obtained.

The second irradiation condition was as follows:
laser wavelength: 1064 nm
laser spot diameter: 40 μm (half width)
laser focal depth: 1.5 μm
laser output: 5 W (processing point)
laser scan speed: 10 mm/min
laser pulse width: 10 ps (picosecond)
laser repetition frequency: 200 kHz.

Example 2

A diamond cutting tool was obtained by using the same method as that of Example 1, except that BLPCD having a light absorption coefficient of 7 $cm^{-1}$ with respect to a laser wavelength of 532 nm was prepared and the second irradiation condition was as follows.

The second irradiation condition was as follows:
laser wavelength: 532 nm
laser spot diameter: 40 μm (half width)
laser focal depth: 1.5 μm
laser output: 6 W (processing point)
laser scan speed: 8 mm/min
laser pulse width: 10 ps (picosecond)
laser repetition frequency: 50 Hz.

Example 3

A diamond cutting tool was obtained by using the same method as that of Example 1, except that SCD having a light absorption coefficient of 9 $cm^{-1}$ with respect to a laser wavelength of 1064 nm was prepared.

Example 4

A diamond cutting tool was obtained by using the same method as that of Example 1, except that SCD having a light absorption coefficient of 5 $cm^{-1}$ with respect to a laser wavelength of 532 nm was prepared and the second irradiation condition was the same as that of Example 2.

Comparative Example 1 and Comparative Example 2

A diamond cutting tool was obtained by using the same method as that of Example 1, except that BLPCD having a light absorption coefficient of 15 $cm^{-1}$ with respect to a laser wavelength of 532 nm was prepared and the second irradiation condition was the same as that of Example 2.

Comparative Example 3

A diamond cutting tool was obtained by using the same method as that of Example 1, except that SCD having a light absorption coefficient of 20 $cm^{-1}$ with respect to a laser wavelength of 532 nm was prepared and the second irradiation condition was the same as that of Example 2.

Comparative Example 4

A diamond cutting tool was obtained by using the same method as that of Example 1, except that SCD having a light absorption coefficient of 1 cm$^{-1}$ with respect to a laser wavelength of 532 nm was prepared and the second irradiation condition was the same as that of Example 2.

Comparative Example 5

A diamond cutting tool was obtained by using the same method as that of Example 1, except that SCD having a light absorption coefficient of 1 cm$^{-1}$ with respect to a laser wavelength of 1064 nm was prepared.

Measurement of Surface Roughness Ra of Flank Face

Three measurement regions were provided on the flank face of the cutting edge portion of the diamond cutting tool according to each of Examples 1 to 4 and Comparative Examples 1 to 5, and a surface roughness Ra in the measurement regions was measured using a laser microscope (product name: "OLS5000" manufactured by Olympus Corporation) in accordance with HS B 0601(2001), The results are shown in Table 1. Each numerical value in "Flank face surface roughness Ra" in Table 1 is an average value of surface roughness Ra measured in the above-described three measurement regions. When the numerical value in "Flank face surface roughness Ra" in Table 1 is equal to or less than 0.1 μm, the diamond cutting tool produced in each of Examples and Comparative Examples can be evaluated as having at least the mirror-processing performance for a workpiece.

Cutting Test

Using the diamond cutting tool according to each of Examples 1 to 4 and Comparative Examples 1 to 5, a round bar member (φ60 mm×length 60 mm), hardness (HRA) 87, manufactured by Sumitomo Electric Industries, made of cemented carbide and serving as a workpiece was cut under the following cutting condition. In this cutting test, cutting was stopped when a distance of cutting of the workpiece reached 1 km, and a flank face maximum wear width (unit: μm) of the diamond cutting tool at this time point was measured by magnifying and observing the flank face with a microscope. The results are shown in Table 1. The smaller the numerical value of the flank face maximum wear width is, the more excellent the wear resistance is. In Table 1, "flank face maximum wear width" of the diamond cutting tool is described in the section of "Flank face wear width (μm)".

Cutting Condition processing machine: NC lathe
cutting speed: 20 m/min
feeding speed: 0.05 mm/rev
cutting depth: 0.2 mm/rev
cutting oil (coolant): none (however, in the cutting test using the diamond cutting tool according to Comparative Example 2, a water-soluble emulsion was used).

Ratios (R1, R2, R3) of Graphite

As to the cutting edge portion of the diamond cutting tool according to each of Examples 1 to 4 and Comparative Examples 1 to 5, the ratios (R1, R3 and R2) of the graphite in the SCD or the BLPCD in a surface of the cutting edge portion (flank face), a plane located at a depth of 0.5 μm from the surface of the cutting edge portion (flank face), and a plane located at a depth of 1 μm from the surface of the cutting edge portion (flank face) were calculated by using the above-described method. The results are shown in Table 1.

TABLE 1

| | Diamond type of cutting edge portion | Laser wavelength in second irradiation condition (nm) | Light absorption coefficient with respect to laser wavelength (cm$^{-1}$) | Flank face surface roughness Ra (μm) | Flank face wear width (μm) | Coolant | Ig/(Ig + Id) R1 Surface | R3 Depth of 0.5 μm | R2 Depth of 1 μm |
|---|---|---|---|---|---|---|---|---|---|
| Example 1 | BLPCD | 1064 | 3 | 0.10 | 22 | none (dry) | 0.87 | 0.34 | 0.03 |
| Example 2 | BLPCD | 532 | 7 | 0.09 | 25 | none (dry) | 0.93 | 0.25 | 0.02 |
| Example 3 | SCD | 1064 | 9 | 0.08 | 34 | none (thy) | 0.97 | 0.12 | 0.01 |
| Example 4 | SCD | 532 | 5 | 0.09 | 31 | none (dry) | 0.91 | 0.16 | 0.01 |
| Comparative Example 1 | BLPCD | 532 | 15 | 0.08 | 51 | none (dry) | 1.0 | 0 | 0 |
| Comparative Example 2 | BLPCD | 532 | 15 | 0.08 | 53 | water-soluble emulsion | 1.0 | 0 | 0 |
| Comparative Example 3 | SCD | 532 | 20 | 0.07 | 67 | none (dry) | 1.0 | 0 | 0 |
| Comparative Example 4 | SCD | 532 | 1 | 0.10 | 82 | none (dry) | 0.45 | 0 | 0 |
| Comparative Example 5 | SCD | 1064 | 1 | 0.10 | 112 | none (dry) | 0.55 | 0.46 | 0.35 |

Discussion

According to Table 1, the diamond cutting tool according to each of Examples 1 to 4 and Comparative Examples 1 to 5 had the same level of flank face surface roughness Ra. In the diamond cutting tool according to each of Examples 1 to 4, the R1 was equal to or more than 0.5 and equal to or less than 1, and the R2 was 0.01 to 0.3. Furthermore, the R3 was lower than the R1 and higher than the R2. In contrast, in the diamond cutting tool according to each of Comparative Examples 1 to 3, the R1 was 1, while the R2 was 0. In this case, the diamond cutting tool according to each of Examples 1 to 4 was smaller in flank face maximum wear width than the diamond cutting tool according to each of Comparative Examples 1 to 3. In the diamond cutting tool according to each of Comparative Examples 4 and 5, the R1 was less than 0.5 or the R2 exceeded 0,3, and the diamond cutting tool according to each of Comparative Examples 4 and 5 was larger in flank face maximum wear width than the diamond cutting tool according to each of Examples 1 to 4. Therefore, the diamond 1.5 cutting tool according to each of Examples 1 to 4 can be evaluated as having increased wear resistance, as compared with the diamond cutting tool according to each of Comparative Examples 1 to 5. Although the diamond cutting tool according to Comparative Example 2 was manufactured by using the same method as that of Comparative Example 1 as described above, the diamond cutting tool according to Comparative Example 2 was larger in flank face maximum wear width than the diamond cutting tool according to Comparative Example 1. This was probably because the workpiece was cooled by the coolant and thus a decrease in hardness of the workpiece caused by a rise in temperature did not occur and the cutting test was performed in this state.

Although the embodiment and examples of the present disclosure have been described above, it is also originally intended to combine features of the embodiment and examples described above as appropriate, or variously modify features of the embodiment and examples described above.

It should be understood that the embodiment and examples disclosed herein are illustrative and non-restrictive in every respect. The scope of the present invention is defined by the terms of the claims, rather than the embodiment and examples above, and is intended to include any modifications within the scope and meaning equivalent to the terms of the claims.

REFERENCE SIGNS LIST

1 cutting edge portion; 11 flank face; S cross section.

The invention claimed is:

1. A diamond cutting tool comprising a cutting edge portion containing single crystal diamond or binderless polycrystalline diamond and graphite, wherein
a surface of the cutting edge portion exhibits Raman spectroscopy peak intensities wherein a ratio R1 of Ig1 to a sum of Id1 and the Ig1 is equal to or more than 0.5 and equal to or less than 1, where the Id1 represents a peak intensity of first carbon in the surface, the Ig1 represents a peak intensity of second carbon in the surface, the first carbon represents carbon that forms the single crystal diamond or the binderless polycrystalline diamond, and the second carbon represents carbon that forms the graphite, and
a plane located at a depth of 1 μm from the surface exhibits Raman spectroscopy peak intensities wherein a ratio R2 of Ig2 to a sum of Id2 and the Ig2 is equal to or more than 0.01 and equal to or less than 0.3, where the Id2 represents a peak intensity of the first carbon in the plane located at the depth of 1 μm from the surface, and the Ig2 represents a peak intensity of the second carbon in the plane located at the depth of 1 μm from the surface, and
wherein content of the graphite decreases substantially continuously from the surface to the plane located at a depth of 1 μm from the surface.

2. The diamond cutting tool according to claim 1, wherein a plane located at a depth of 0.5 μm from the surface exhibits Raman spectroscopy peak intensities wherein a ratio R3 of Ig3 to a sum of Id3 and the Ig3 is lower than the R1 and higher than the R2, where the Id3 represents a peak intensity of the first carbon in the plane located at the depth of 0.5 μm from the surface, and the Ig3 represents a peak intensity of the second carbon in the plane located at the depth of 0.5 μm from the surface.

3. The diamond cutting tool according to claim 1, wherein the surface is a surface of a flank face.

4. A method for manufacturing the diamond cutting tool as recited in claim 1, the method comprising:
preparing the single crystal diamond or the binderless polycrystalline diamond;
performing laser processing on the single crystal diamond or the binderless polycrystalline diamond under a first irradiation condition, thereby obtaining the cutting edge portion including a cutting edge; and
performing laser processing on the cutting edge portion under a second irradiation condition different from the first irradiation condition, thereby generating graphite in the cutting edge portion.

5. The method for manufacturing the diamond cutting tool according to claim 4, wherein
the second irradiation condition is such that
a laser wavelength is equal to or more than 532 nm and equal to or less than 1064 nm,
a laser spot diameter is equal to or more than 5 μm and equal to or less than 70 μm as a half width,
a laser focal depth is equal to or more than 1 mm,
a laser output is equal to or more than 1 W and equal to or less than 20 W at a processing point;
a laser scan speed is equal to or more than 5 mm/sec and equal to or less than 100 mm/sec, and
a laser repetition frequency is equal to or more than 10 Hz and equal to or less than 1 MHz.

* * * * *